United States Patent
Wang et al.

(10) Patent No.: US 12,341,317 B2
(45) Date of Patent: Jun. 24, 2025

(54) WAVE SHAPING CIRCUIT FOR LASER DRIVING CIRCUIT, LASER DRIVING CIRCUIT AND LASER DEVICE

(71) Applicants: Suzhou Menovex Photonics Technology Co., Ltd, Suzhou (CN); Menovex Medical Technology (Shenzhen) Co., Ltd, Guangdong (CN)

(72) Inventors: Qiyou Wang, Guangdong (CN); Jianwei Huang, Guangdong (CN); Encai Ji, Guangdong (CN); Yixiang Dai, Guangdong (CN)

(73) Assignees: Suzhou Menovex Photonics Technology Co., Ltd, Suzhou (CN); Menovex Medical Technology (Shenzhen) Co., Ltd, Shenzhen (CN)

( * ) Notice: Subject to any disclaimer, the term of this patent is extended or adjusted under 35 U.S.C. 154(b) by 0 days.

(21) Appl. No.: 18/920,010

(22) Filed: Oct. 18, 2024

(65) Prior Publication Data
US 2025/0047062 A1    Feb. 6, 2025

Related U.S. Application Data

(63) Continuation of application No. PCT/CN2024/100257, filed on Jun. 20, 2024.

(51) Int. Cl.
*H01S 5/042* (2006.01)
*H01S 5/026* (2006.01)

(52) U.S. Cl.
CPC ............ *H01S 5/042* (2013.01); *H01S 5/0261* (2013.01)

(58) Field of Classification Search
CPC ...... H01S 5/042; H01S 5/0261; H01S 5/0428; H01S 5/06216
See application file for complete search history.

(56) References Cited

U.S. PATENT DOCUMENTS 5,936,986 A * 8/1999 Cantatore ............... H01S 5/042
                                                         372/31
2004/0086006 A1* 5/2004 Tanikoshi ........... H01S 5/06804
                                                       372/29.02
(Continued)

FOREIGN PATENT DOCUMENTS

CN        1499683 A     5/2004
CN      101923870 A    12/2010
(Continued)

OTHER PUBLICATIONS

PCT/CN2024/100257 International Search Report; Aug. 25, 2023, Chinese Original, 3p.
(Continued)

*Primary Examiner* — Yuanda Zhang
(74) *Attorney, Agent, or Firm* — Addison D. Ault; IPGentleman Intellectual Property Services, LLC

(57) ABSTRACT

The present application provides a wave shaping circuit of a laser driving circuit, a laser driving circuit and a laser device, by attenuating the wave at the start of the pulse to a lower power, and then outputting the original pulse power after a delay, the laser relaxation oscillations disappears or occurs at a lower power of the light emission, with which the amplitude and probability of generation of the relaxation oscillations are reduced, thereby reducing the abnormal power at the moment of pulse operation and preventing the optical fiber from being overheated and damaged.

14 Claims, 4 Drawing Sheets

(56) References Cited

U.S. PATENT DOCUMENTS

| | | | | |
|---|---|---|---|---|
| 2010/0309938 | A1* | 12/2010 | Fujita | G11B 7/126 |
| | | | | 372/25 |
| 2017/0163232 | A1* | 6/2017 | Mimino | H03F 3/19 |
| 2019/0326727 | A1* | 10/2019 | Kondo | H03F 3/45475 |

FOREIGN PATENT DOCUMENTS

| | | | |
|---|---|---|---|
| CN | 117154535 | A | 12/2023 |
| JP | 2011151210 | A | 8/2011 |
| JP | 2011238863 | A | 11/2011 |

OTHER PUBLICATIONS

PCT/CN2024/100257 International Search Report; Aug. 25, 2023, English Translation, 2p.

PCT/CN2024/100257 Written Opinion of the International Search Authority; Aug. 25, 2023, Chinese Original, 5p.

PCT/CN2024/100257 Written Opinion of the International Search Authority; Aug. 25, 2023, English Translation, 5p.

CN1499683A; May 26, 2004; Sadao Tanigoe ; English Machine Translation, 15p.

CN101923870A; Dec. 22, 2010; Goro Fujita; 12p.

CN117154535A; Dec. 1, 2023; Wang, Qiyou 11p.

JP2011151210A; Aug. 4, 2011; Shigehiro Takashima; 12p.

JP2011238863A; Nov. 24, 2011; Yoshihiro Imaso; 13p.

CNIPA 202311093292.3 Office Action dated May 9, 2024; Original Chinese; 7p.

CNIPA 202311093292.3 Office Action dated May 9, 2024; English translation; 6p.

CNIPA 202311093292.3 Notice of Allowance dated Jun. 17, 2024; Original Chinese; 3p.

CNIPA 202311093292.3 Notice of Allowance dated Jun. 17, 2024; English translation; 2p.

* cited by examiner ical field

WAVE SHAPING CIRCUIT FOR LASER DRIVING CIRCUIT, LASER DRIVING CIRCUIT AND LASER DEVICE

CROSS-REFERENCES TO RELATED APPLICATIONS

The present application claims priority to Chinese patent application No. 2023110932923, filed with the Chinese Patent Office on Aug. 25, 2023, entitled "Wave shaping circuit for laser driving circuit, laser driving circuit and laser device", the entire contents of which are incorporated herein by reference.

TECHNICAL FIELD

The present application relates to the field of laser technology, and in particular to wave shaping circuit of laser driving circuit, laser driving circuit and laser device.

BACKGROUND TECHNOLOGY

Existing driving circuits of laser devices are generally fed from the front end with analog DC signals or pulse signals, and the pulse signals are basically ordinary square wave signals.

Laser devices will output corresponding pulsed light after feeding the pulse signal. However, most laser devices do not have only one laser diode (LD), but require a combination of more than one laser LD, resulting in the need for parallel connection of the output optical fiber in the combination, it is likely to lead to the fiber burnout when the laser devices work in a high power within this structure. Fiber burnout is due to large relaxation oscillations at the beginning of the pulse, this oscillation is superimposed on the high current corresponding to the high power, resulting in the fiber being subjected to several times the normal power at the start moment of the pulse, far more than the rated power of the fiber, so that the fiber is quickly overheated and burnt out.

SUMMARY

The purpose of this application is to solve the problem of overheating and damaging the optical fiber by the phenomenon of large relaxation oscillations at the beginning of the pulse of existing laser devices.

In order to solve the above problem, the present application provides a wave shaping circuit for a laser driving circuit, comprising a signal input interface, a trigger starting unit, a delayed power supply control unit, a delay unit, an attenuation control unit, a constant voltage control unit, a signal coupling unit and a signal output interface; the signal input interface is connected to the trigger starting unit and the signal coupling unit respectively, and the input signal is divided into two signals after passing through the signal input interface, and is fed into the trigger starting unit and the signal coupling unit respectively. The signal coupling unit and the attenuation control unit are respectively connected to the signal output interface. The trigger starting unit is configured to control the delayed power supply control unit to turn on if the voltage of the input signal is greater than the preset trigger comparison voltage; in the case of the delayed power supply control unit turning on, the delay unit makes the attenuation control unit turn on to enable the input signal to be attenuated by the constant voltage control unit after passing through the signal coupling unit, after a delayed length of time the delay unit causes the attenuation control unit to turn off, and the input signal is not attenuated after the signal coupling unit; the constant voltage control unit is connected to the attenuation control unit and is configured to control the amount of the attenuation of the input signal.

Optionally, the trigger starting unit is triggered to flip at the end of the input signal, the delayed power supply control unit is turned off, and the attenuation control unit is turned off.

Optionally, the trigger starting unit comprises a first operational amplifier, a first resistor and a first rheostat; the upper end of the first resistor is connected to the power supply voltage, the lower end is connected to the upper end of the first rheostat, and the lower end of the first rheostat is grounded; the positive electrode of the first operational amplifier is connected to the signal input interface, the negative electrode of the first operational amplifier is connected to the lower end of the first resistor and the center tap of the first rheostat, and the output end of the first operational amplifier is connected to the delayed power supply control unit.

Optionally, the delay unit comprises a first capacitor and a second rheostat; the upper end of the second rheostat is connected to a power supply voltage through the delayed power supply control unit, the lower end of the second adjustable resistor is connected to the upper end of the first capacitor, the lower end of the first capacitor is grounded; the upper end of the second rheostat, the center tap of the second rheostat are both connected to the attenuation control unit, and is configured to supply power to the attenuation control unit to turn on the attenuation control unit; the lower end of the second rheostat is connected to the attenuation control unit, and is configured to trigger the attenuation control unit to turn off based on a voltage boost of the first capacitor.

Optionally, the first rheostat and the second rheostat are potentiometers or variable resistors.

Optionally, the attenuation control unit comprises a detection control chip and a first switching element; the power supply end of the detection control chip is connected to the upper end of the second rheostat and the center tap of the second rheostat, and the input end of the detection control chip is connected to the lower end of the second rheostat; the output end of the detection control chip is connected to a base electrode of the first switching element, the collector of the first switching element is connected to the signal coupling unit, the signal output interface, and the emitter of the first switching element is grounded.

Optionally, the detection control chip is configured to control the on-off of the first switching element.

Optionally, the constant voltage control unit comprises a second operational amplifier, a second resistor, a third resistor, a fourth resistor and a third rheostat; the positive electrode of the second operational amplifier is connected to the power supply voltage through the second resistor and is grounded through the third rheostat, the negative electrode is grounded through the third resistor and the fourth resistor, and the output end is connected between the third resistor and the fourth resistor; the emitter of the first switching element is connected between the third resistor and the fourth resistor and is grounded through the fourth resistor.

Optionally, the delayed power supply control unit comprises a second switching element; the base electrode of the second switching element is connected to the output of the first operational amplifier, the emitter is connected to the power supply voltage, and the collector is connected to the upper end of the second rheostat.

Optionally, the signal coupling unit comprises a fifth resistor, the fifth resistor is connected between the signal input interface and the signal output interface.

The present application provides a laser driving circuit comprising any of above wave shaping circuit of the laser driving circuit.

Optionally, the trigger starting unit is triggered to flip at the end of the input signal, the delayed power supply control unit is turned off, and the attenuation control unit is turned off.

Optionally, the trigger starting unit comprises a first operational amplifier, a first resistor and a first rheostat; the upper end of the first resistor is connected to the power supply voltage, the lower end of the first resistor is connected to the upper end of the first rheostat, and the lower end of the first rheostat is grounded; the positive electrode of the first operational amplifier is connected to the signal input interface, the negative electrode of the first operational amplifier is connected to the lower end of the first resistor and the center tap of the first rheostat, the output end of the first operational amplifier is connected to the delayed power supply control unit.

Optionally, the delay unit comprises a first capacitor and a second rheostat; the upper end of the second rheostat is connected to the power supply voltage through the delayed power supply control unit, the lower end of the second rheostat is connected to the upper end of the first capacitor, and the lower end of the first capacitor is grounded. The upper end of the second rheostat and the center tap of the second rheostat are both connected to the attenuation control unit and are configured to supply power to the attenuation control unit to turn on the attenuation control unit. The lower end of the second rheostat is connected to the attenuation control unit and is configured to trigger the attenuation control unit to turn off based on a boost of the first capacitor.

Optionally, the first rheostat and the second rheostat are potentiometers or variable resistors.

The present application provides a laser device comprising any of the above laser driving circuits.

By attenuating the wave at the start of the pulse to a lower power, and then outputting the original pulse power after a delay, embodiments of the present application cause the laser relaxation oscillations to disappear or to occur at a lower power of the light emission, with which an amplitude and probability of generation of the relaxation oscillations are reduced, thereby reducing the abnormal power at the moment of pulse operation and preventing the optical fiber from being overheated and damaged.

DESCRIPTION OF DRAWINGS

In order to illustrate the technical solutions more clearly in the embodiments or prior art of the present application, the following will briefly introduce the accompanying drawings that need to be used in the description of the specific embodiments or prior art, and it is obvious that the accompanying drawings in the following description are some of the embodiments of the present application, and for the person of ordinary skill in the field, other drawings can be obtained according to these drawings, without inventive effort.

SPECIFIC EMBODIMENTS

In order to make the above purposes, features and advantages of the present application more obvious and understandable, specific embodiments of the present application are described in detail below in conjunction with the accompanying drawings. It should be understood that the specific embodiments described herein are only for the purpose of explaining the present application and do not limit the present application.

The improved design in the embodiments of this application is to reduce the wave at the start of the pulse to the lowest power of the laser light emission, and then output the pulse power of the corresponding power after a delay, so that the laser relaxation oscillation occurs at the lowest power of the light emission, and the pulse power is normally output without relaxation oscillation, such that the power generated by the relaxation oscillation has been substantially reduced. It has been proved that the use of the driving circuit in the present application significantly improves the amplitude of the relaxation oscillations generated by the laser emission and the probability of relaxation oscillations, thus preventing the fiber being burnt out.

Figure 1:
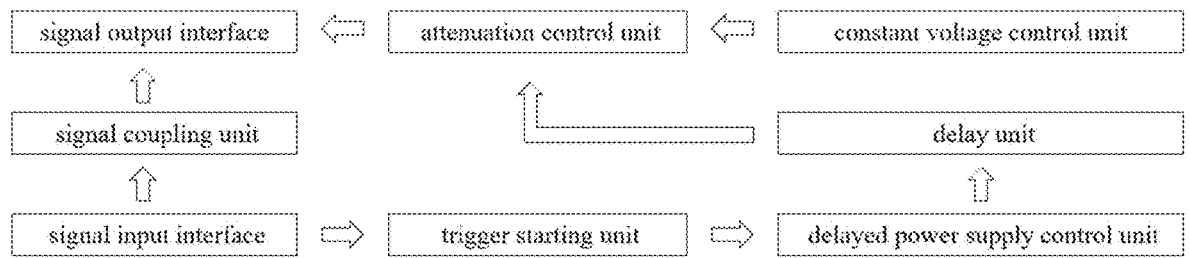
FIG. 1 shows a schematic structure of a wave shaping circuit for a laser driving circuit in an embodiment of the present application.

Referring to the structural schematic diagram of a wave shaping circuit of a laser device driving circuit shown in FIG. 1, it is shown that the wave shaping circuit comprises a signal input interface, a trigger starting unit, a delayed power supply control unit, a delay unit, an attenuation control unit, a constant voltage control unit, a signal coupling unit, and a signal output interface.

The wave shaping circuit may be used as a pre-stage circuit of a driving circuit of a semiconductor laser device. Specifically, the signal input interface is connected to the trigger starting unit and the signal coupling unit, respectively, and the input signal is divided into two signals after passing through the signal input interface and is fed into the trigger starting unit and the signal coupling unit, respectively; the signal coupling unit and the attenuation control unit are connected to the signal output interface, respectively.

The trigger starting unit is configured to control the delayed power supply control unit to turn on if the voltage of the input signal is greater than a predetermined trigger comparison voltage. By adjusting this trigger comparison voltage, the amplitude of the trigger signal can be adjusted for flexible application.

In the case where the delay power supply control unit is on, the delay unit causes the attenuation control unit to turn on, so that the input signal is attenuated by the constant voltage control unit after passing through the signal coupling unit, and after a predetermined delayed time the delay unit causes the attenuation control unit to turn off, and the input signal is not attenuated after passing through the signal coupling unit. Wherein the input signal is attenuated by the constant voltage control unit to the lowest power of the laser light emission, reducing the power as much as possible at the same time ensuring the light emission, so that the power is low when the laser relaxation oscillation occurs, and overheating of the optical fiber is avoided. The time delayed by the delay unit is adjustable, specific time delayed can be adjusted according to specific need for flexible application.

The constant voltage control unit is connected to the attenuation control unit and is configured to control the amount of the attenuation of the input signal. The constant voltage potential is adjustable to output an attenuation signal with a preset amount.

By attenuating the wave at the start of the pulse to a lower power, and then outputting the original pulse power after a delay, the wave shaping circuit for a laser driving circuit provided in embodiments of the present application causes the laser relaxation oscillations to disappear or to occur at a lower power of the light emission, with which an amplitude and probability of generation of the relaxation oscillations are reduced, which reduces the abnormal power at the moment of pulse operation, so that the optical fiber will not be overheated and damaged.

Further, the trigger starting unit is triggered to flip at the end of the above input signal, the delayed power supply control unit is turned off, and the attenuation control unit is turned off. When the input signal ends in zero, the above wave shaping circuit returns to the initial state.

As an example, the signal input from a pre-stage or an external input is divided into two signals after the signal input interface, in which one signal is sent to the trigger starting unit, and configured to turn on the delayed power supply control unit after being triggered, and then the output voltage is supplied to the delay unit and the attenuation control unit respectively, and the attenuation control unit is turned on at the beginning of the power supply due to the control of the delay unit, so that the signal input from the signal input interface after passing through the signal coupling unit is attenuated, in which the constant voltage control unit controls the amount of the signal attenuation, the attenuation control unit is turned off after the delayed time, the signal from the signal coupling unit is kept as the original value without attenuation, and sent to the laser device rear stage driving circuit to drive the laser LD to light after passing through the signal output interface, the circuit return to the initial state when the signal is zeroed at the end of the signal.

Repeat the above process in a PWM (Pulse Width Modulation) signal mode, so that there is a threshold voltage with a certain length of time and a certain amplitude at the beginning of each pulse, by adjusting the length of time and the amplitude needed, the relaxation oscillation disappears or occurs at the beginning of the threshold voltage wave, which ensures that the main wave of the pulse has a normal output power.

In CW (Continuous Wave) continuous output mode, based on the above process, a threshold voltage delayed wave is added at the beginning of the wave, and the output power of the subsequent successive main wave is kept normal, which also avoids the superimposition effect of the relaxation oscillation wave on the main wave power.

Therefore, the above technical solution can be used for laser driving circuits with both PWM pulse signals and continuous signals, avoiding the burning of the optical fiber due to relaxation oscillation problems and improving the safety of the equipment.

As an example, the trigger starting unit comprises a first operational amplifier, a first resistor and a first rheostat. The upper end of the first resistor is connected to the power supply voltage, the lower end if the first resistor is connected to the upper end of the first rheostat, and the lower end of the first rheostat is grounded; the positive electrode of the first operational amplifier is connected to the signal input interface, the negative electrode is connected to the lower end of the first resistor and the center tap of the first rheostat, and the output end is connected to the delayed power supply control unit.

The first resistor and the first rheostat form a voltage divider circuit, which serves as a negative input of the first operational amplifier, and the input signal serves as a positive input of the first operational amplifier, and the two signals are compared. As an example, the rheostat in this embodiment may be an element such as a potentiometer, a variable resistor, and the like. By adjusting the first rheostat to adjust the trigger comparison voltage, the amplitude of the trigger signal is thus adjustable for flexible application.

As an example, the delay unit comprises a first capacitor and a second rheostat; the upper end of the second rheostat is connected to a power supply voltage through the delayed power supply control unit, the lower end of the second rheostat is connected to the upper end of the first capacitor, and the lower end of the first capacitor is grounded; the upper end of the second rheostat, and the center tap of the second rheostat are connected to an attenuation control unit, and are configured to supply power to the attenuation control unit to turn on the attenuation control unit; the lower end of the second rheostat is connected to the attenuation control unit, and is configured to trigger the attenuation control unit to turn off based on the boosting of the first capacitor.

After the input signal is input, the attenuation control unit is triggered to turn on, then is delayed through the RC delay circuit composed of a capacitor and a resistor, and then triggers the attenuation control unit to turn off after the voltage at the capacitor rises to the set voltage, wherein the length of the delay time is adjustable for flexible application.

As an example, the above attenuation control unit comprises a detection control chip and a first switching element; the power supply end of the detection control chip is connected to the upper end of the second rheostat and the center tap of the second rheostat, and the input end of the detection control chip is connected to the lower end of the second rheostat; the output end of the detection control chip is connected to the base electrode of the first switching element, and the collector electrode of the first switching element is connected to the signal coupling unit and the signal output interface, and the emitter of the first switching element is grounded.

The detection control chip may control the on-off of the first switching element, thereby controls whether the input signal is attenuated.

As an example, the constant voltage control unit comprises a second operational amplifier, a second resistor, a third resistor, a fourth resistor, and a third rheostat; the positive electrode of the second operational amplifier is connected to the power supply voltage through the second resistor, is grounded through the third rheostat, the negative pole of the second operational amplifier is grounded through the third resistor and the fourth resistor, and the output of the second operational amplifier is connected between the third resistor and the fourth resistor. The emitter of the first switching element is connected between the third resistor and the fourth resistor, and is grounded through the fourth resistor.

The constant voltage control unit comprises the operational amplifiers, and by means of the above-described connection, the voltage output from its output terminal can be kept constant to function as a constant voltage output. The input signal is attenuated and limited to the voltage drop of the fourth resistor.

As an example, the delayed power supply control unit comprises a second switching element; the base electrode of the second switching element is connected to the output terminal of the first operational amplifier, the emitter of the second switching element is connected to the power supply voltage, and the collector electrode of the second switching element is connected to the upper end of the second rheostat.

This second switching element is controlled by the output signal of the first operational amplifier described above, and its on-off state can control the charging of the delay unit and the power supply of the attenuation control unit.

As an example, the signal coupling unit includes a fifth resistor, and the fifth resistor is connected between the signal input interface, and the signal output interface.

Figure 2:
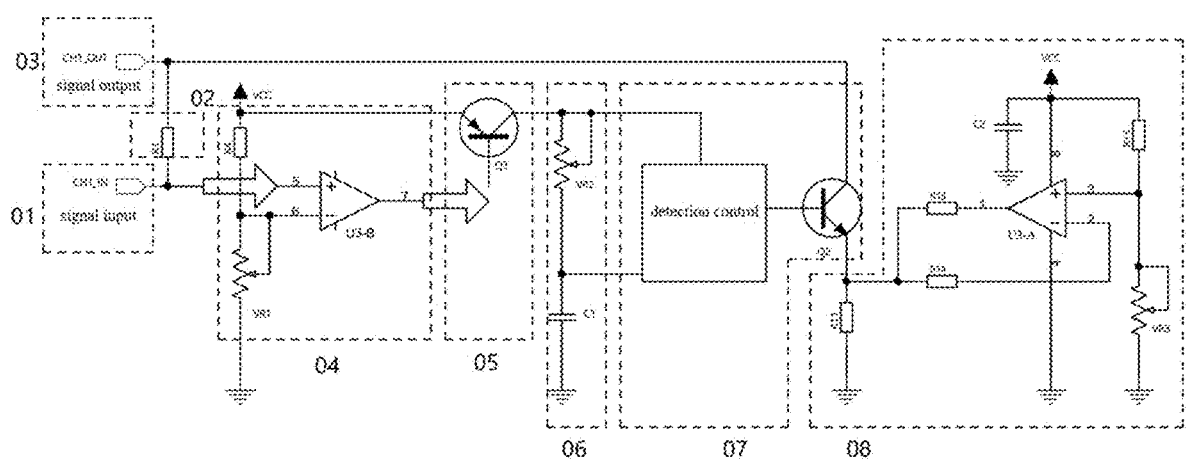
FIG. 2 shows a circuit diagram of a wave shaping circuit for a laser driving circuit in an embodiment of the present application.

Referring to the circuit diagram of a wave shaping circuit of a laser driving circuit shown in FIG. 2, a signal input interface 01, a signal coupling unit 02, a signal output interface 03, a trigger starting unit 04, a delayed power supply control unit 05, a delay unit 06, an attenuation control unit 07, and a constant voltage control unit 08 are shown.

The signal input interface 01 comprises a signal input interface CH1_IN, which is respectively connected to the lower end of the resistor R1 of the signal coupling unit 02 and to the pin 5 of the operational amplifier U3-B through the input of the trigger starting unit 04 (see the arrow in FIG. 2).

The trigger starting unit 04 input network is connected to pin 5 of U3-B, the lower end of the potentiometer VR1 is grounded, the upper end of the resistor R4 is connected to the power supply VCC, pin 6 of U3-B is respectively connected to the lower end of R4, the upper end and the center tap of VR1, and pin 7 of U3-B is connected to the control end of the delayed power supply control unit 05.

The B pole of a switch tube Q3 of the delayed power supply control unit 05 is the control end, the E pole power supply end is connected to the power supply VCC, and the C pole of Q3 is the voltage output end, which is respectively connected to the upper end and the center tap of the potentiometer VR2 of the delay unit 06, and the detection control component of the attenuation control unit 07.

The lower end of VR2 in the delay unit 06 is respectively connected to the upper end of the capacitor C1 and the detection control component of the attenuation control unit 07, and the lower end of C1 is grounded.

The attenuation control unit 07 comprises a detection control chip, whose output is connected to the B pole of a switch tube Q2, the E pole of Q2 is respectively connected to the upper end of the resistor R11 of the constant voltage control unit 08, the left ends of the resistor R13 and the resistor R14, and the C pole of Q2 is respectively connected to the upper end of the resistor R1 of the signal coupling unit 02 and the signal output interface CH1_OUT.

The lower end of the resistor R11 of the constant voltage control unit 08 is grounded, the right end of the resistor R14 is connected to pin 2 of the operational amplifier U3-A, the right end of the resistor R13 is connected to pin 1 of U3-A, pin 4 of U3-A is grounded, pin 3 of U3-A is respectively connected to the lower end of the resistor R15, the upper end and the center tap of VR3, the lower end of VR3 is grounded, pin 8 of U3-A, the upper end of R15 and the upper end of the capacitor C2 are respectively connected to the power supply VCC, and the lower end of C2 is grounded.

The working process of the above circuit is as follows:
(1) The input signal is divided into 2 signals after being input from CH1_IN and sent to R1 and the input network of the trigger starting unit 04 respectively;
(2) the signal is sent to pin 5 of U3 through the input network, when the voltage at pin 5 is greater than that at pin 6 and a voltage division is generated by the R4 and VR1, Q3 is driven to conduct with the output from pin 7 of the operational amplifier U3;
(3) after Q3 is turned on, one signal passes through the detection control component to drive Q2 to turn on; and the other signal charges C1 through VR2, when C1 is charged to the pre-set voltage, the detection control component controls Q2 to cut off.
(4) the voltage division composed by R15 and VR3 is input to the U3-A, the voltage of R11 is kept the same as the voltage of VR3 according to the rail-to-rail characteristics of the operational amplifier, when the external signal is superimposed on the R11, the changes at the output of pin 1 of the U3-A keep the voltage of R11 unchanged through the feedback of R14.
(5) the input signal reaches the signal output after passing through R1 and an output signal from the signal out is controlled by Q2, when Q2 is turned on, the signal is attenuated and limited to the voltage drop of R11 (i.e., the pre-set voltage value of VR3), when Q2 is cut-off, the amplitude of the output signal is kept the same as that of the input signal.
(6) VR2 and C1 form an RC delay circuit, by adjusting VR2 the on-time of Q2 is set thus to set the threshold time of the output signal, the threshold time refers to the holding time of the minimum amplitude of the driving signal for which the laser light can be emitted.
(7) VR1 can be adjusted to set the trigger comparison voltage amplitude of the circuit in this application.
(8) the amplitude threshold of the output signal is set by adjusting VR3, wherein the amplitude threshold refers to the minimum amplitude of the driving signal for which the laser can be emitted.

In the circuit provided in this embodiment, the amplitude of the trigger signal is adjustable, the delay time is adjustable and the constant voltage potential is adjustable for flexible application. By adding the delayed constant voltage wave before the main pulse wave, so that the relaxation oscillation is moved to the delayed constant voltage wave, with which an amplitude and probability of generation of the relaxation oscillations are reduced, which reduces the abnormal power at the moment of pulse operation, so that the optical fiber will not be overheated and damaged. The circuit has good versatility, and is applicable to the wave with PWM mode, at the same time CW continuous DC driving mode is not affected and can work normally.

Figure 3:
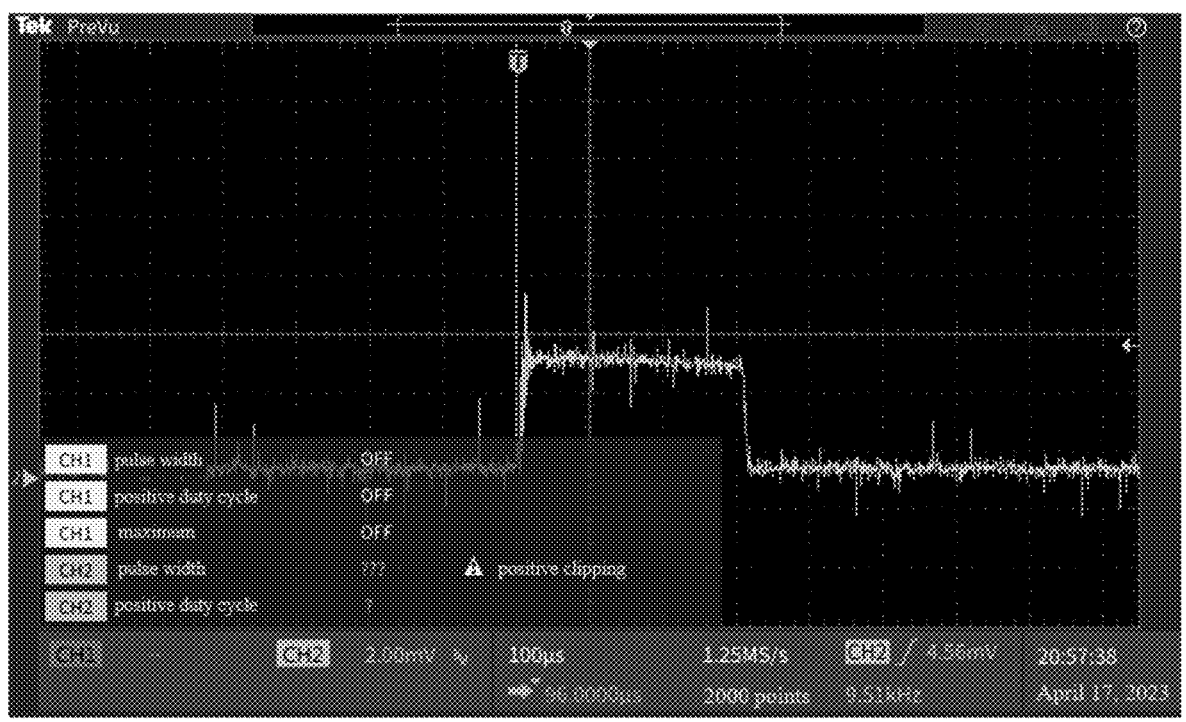
FIG. 3 shows a diagram of an output wave of a laser device without the wave shaping circuit provided by embodiments of the present application.
Figure 4:
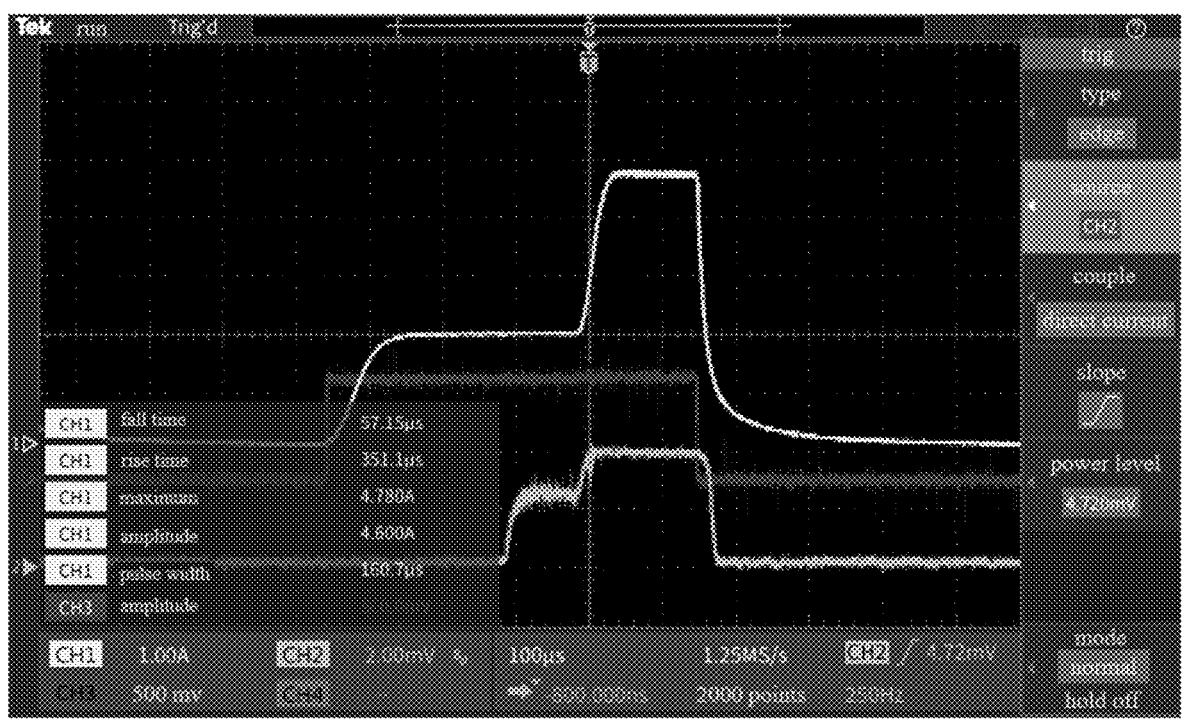
FIG. 4 shows a diagram of an output wave of a laser device with a wave shaping circuit provided by embodiments of the present application.

FIG. 3 shows a diagram of an output wave of a laser device without the wave shaping circuit provided by embodiments of the present application. FIG. 4 shows a diagram of an output wave of a laser device with a wave shaping circuit provided by embodiments of the present application. At the top of FIG. 4 is the wave of the driving current, and at the bottom is the laser wave. By comparing FIG. 3 and FIG. 4, it can be seen that the initial power is lower and the laser relaxation oscillation is suppressed after adding the wave shaping circuit.

Although the present application is disclosed as above, it is not limited thereto. Any person skilled in the art may make various changes and modifications without departing from the spirit and scope of the present application, and therefore the scope of protection of the present application shall be based on the scope as limited by the claims.

Finally, it should also be noted that, in this application, relational terms such as first and second are used only to distinguish one entity or operation from another, and do not necessarily require or imply the existence of any such actual relationship or order between these entities or operations. Furthermore, the terms "including", "comprising", or any other variant thereof, are intended to cover non-exclusive inclusion, such that a process, a method, an article, or an equipment comprising a set of elements includes not only those elements, but also other elements not explicitly listed, or that are inherent to such process, method, article or equipment. Without more constraints, an element defined by the phrase "comprising a . . . " does not exclude the existence of other identical elements in the process, method, article or equipment comprising the element.

The above description of the disclosed embodiments enables those skilled in the art to implement or use the present application. Various modifications to these embodiments will be apparent to those skilled in the art, and the general principles defined herein may be implemented in other embodiments without departing from the spirit or scope of the present application. Therefore, the present application will not be limited to the embodiments shown herein, but will conform to the widest scope consistent with the principles and novel features disclosed herein.

INDUSTRIAL APPLICABILITY

The wave shaping circuit of laser driving circuit, laser driving circuit and laser device provided in the embodiments of the present application, by attenuating the wave at the start of the pulse to a lower power, and then outputting the original pulse power after a delay, the laser relaxation oscillations are made to disappear or to occur at a lower power of the light emission, with which an amplitude and probability of generation of the relaxation oscillations are reduced, which reduces the abnormal power at the moment of pulse operation, so that the optical fiber will not be overheated and damaged, and have significant economic benefits.

The invention claimed is:

1. A wave shaping circuit for a laser driving circuit, characterized in that it comprises a signal input interface, a trigger starting unit, a delayed power supply control unit, a delay unit, an attenuation control unit, a constant voltage control unit, a signal coupling unit, and a signal output interface,
    the signal input interface being respectively connected to the trigger starting unit and the signal coupling unit, and the input signal being divided into two signals after passing through the signal input interface, and being respectively sent to the trigger starting unit and the signal coupling unit, the signal coupling unit and the attenuation control unit being respectively connected to the signal output interface,
    the trigger starting unit being configured to control the delayed power supply control unit to turn on when the voltage of the input signal is greater than a preset trigger comparison voltage,
    when the delayed power supply control unit is turned on, the delay unit makes the attenuation control unit turn on, so that the input signal is attenuated by the constant voltage control unit after passing through the signal coupling unit, and after a delayed length of time, the delay unit turns off the attenuation control unit, and the input signal is not attenuated after the signal coupling unit,
    the constant voltage control unit being connected to the attenuation control unit and being configured to control the amount of attenuation of the input signal,
    the trigger starting unit comprises a first operational amplifier, a first resistor and a first rheostat,
    an upper end of the first resistor being connected to a power supply voltage, a lower end of the first resistor being connected to an upper end of the first rheostat, and a lower end of the first rheostat being grounded, a positive electrode of the first operational amplifier being connected to the signal input interface, a negative electrode of the first operational amplifier being connected to the lower end of the first resistor and a center tap of the first rheostat, and an output end of the first operational amplifier being connected to the delayed power supply control unit,
    the delay unit comprises a first capacitor and a second rheostat,
    an upper end of the second rheostat being connected to the power supply voltage through the delayed power supply control unit, a lower end of the second rheostat being connected to an upper end of the first capacitor, and a lower end of the first capacitor being grounded,
    the upper end of the second rheostat and a center tap of the second rheostat both being connected to the attenuation control unit, and being configured to supply power to the attenuation control unit to turn on the attenuation control unit,
    the lower end of the second rheostat being connected to the attenuation control unit, and being configured to trigger the attenuation control unit to turn off based on a voltage boost of the first capacitor.

2. The wave shaping circuit according to claim 1, characterized in that the trigger starting unit is triggered to flip at the end of the input signal, the delayed power supply control unit is turned off, and the attenuation control unit is turned off.

3. The wave shaping circuit according to claim 1, characterized in that the first rheostat and the second rheostat are potentiometers or variable resistors.

4. The wave shaping circuit according to claim 1, characterized in that the attenuation control unit comprises a detection control chip and a first switching element,
    a power supply end of the detection control chip being connected to the upper end of the second rheostat and the center tap of the second rheostat, and the input terminal of the detection control chip being connected to the lower end of the second rheostat;
    an output end of the detection control chip being connected to a base electrode of the first switching element, a collector of the first switching element being connected to the signal coupling unit and the signal output interface, and an emitter of the first switching element being grounded.

5. The wave shaping circuit according to claim 4, characterized in that the detection control chip is configured to control the on-off of the first switching element.

6. The wave shaping circuit according to claim 4, characterized in that the constant voltage control unit comprises a second operational amplifier, a second resistor, a third resistor, a fourth resistor and a third rheostat,
    a positive electrode of the second operational amplifier being connected to the power supply voltage through the second resistor, being grounded through the third rheostat, a negative electrode of the second operational amplifier being grounded through the third resistor and the fourth resistor, and an output of the second operational amplifier being connected between the third resistor and the fourth resistor;

the emitter of the first switching element being connected between the third resistor and the fourth resistor and being grounded through the fourth resistor.

7. The wave shaping circuit according to claim 1, characterized in that the delayed power supply control unit comprises a second switching element, a base electrode of the second switching element being connected to the output of the first operational amplifier, an emitter of the second switching element being connected to the power supply voltage, and a collector electrode being connected to the upper end of the second rheostat.

8. The wave shaping circuit according to claim 1, characterized in that the signal coupling unit comprises a fifth resistor, the fifth resistor being connected between the signal input interface and the signal output interface.

9. A laser driving circuit characterized in that it includes a wave shaping circuit of the laser driving circuit according to claim 1.

10. The laser driving circuit according to claim 9, characterized in that the trigger starting unit is triggered to flip at the end of the input signal, the delayed power supply control unit is turned off, and the attenuation control unit is turned off.

11. The laser driving circuit according to claim 9, characterized in that the first rheostat and the second rheostat are potentiometers or variable resistors.

12. A laser device, characterized in that it comprises the laser driving circuit according to claim 9.

13. A laser device, characterized in that it comprises the laser driving circuit according to claim 10.

14. A laser device, characterized in that it comprises the laser driving circuit according to claim 11.

* * * * *